United States Patent
Zhang et al.

(10) Patent No.: US 7,943,525 B2
(45) Date of Patent: May 17, 2011

(54) METHOD OF PRODUCING MICROELECTROMECHANICAL DEVICE WITH ISOLATED MICROSTRUCTURES

(75) Inventors: Lisa Z. Zhang, Gilbert, AZ (US); Lisa H. Karlin, Chandler, AZ (US); Ruben B. Montez, Cedar Park, TX (US); Woo Tae Park, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 255 days.

(21) Appl. No.: 12/340,202

(22) Filed: Dec. 19, 2008

(65) Prior Publication Data

US 2010/0155861 A1 Jun. 24, 2010

(51) Int. Cl.
*H01L 21/302* (2006.01)
(52) U.S. Cl. .............................. 438/738; 258/E21.545
(58) Field of Classification Search .................. 257/415, 257/E21.545, E29.324; 438/424, 50, 482, 438/705, 706, 738
See application file for complete search history.

(56) References Cited

U.S. PATENT DOCUMENTS

| | | | |
|---|---|---|---|
| 5,580,815 A * | 12/1996 | Hsu et al. ................... | 438/362 |
| 6,121,552 A | 9/2000 | Brosnihan et al. | |
| 6,170,332 B1 | 1/2001 | MacDonald et al. | |
| 6,342,430 B1 | 1/2002 | Adams et al. | |
| 6,395,644 B1 | 5/2002 | Hopper et al. | |
| 6,686,638 B2 | 2/2004 | Fischer et al. | |
| 6,770,506 B2 | 8/2004 | Gogoi | |
| 6,914,316 B2 | 7/2005 | Yun et al. | |
| 6,936,491 B2 | 8/2005 | Partridge et al. | |
| 6,960,488 B2 | 11/2005 | Brosnihan et al. | |
| 7,352,040 B2 | 4/2008 | Partridge et al. | |
| 2006/0148133 A1 | 7/2006 | Nunan et al. | |

OTHER PUBLICATIONS

PCT Application No. PCT/US2009/065905; Search Report and Written Opinion dated Jun. 14, 2010.
Brosnihan et al., Embedded Interconnect and Electrical Isolation for High-Aspect-Ratio, SOI Inertial Instruments, Transducers '97, 1997 International Conference on Solid-State Sensors and Actuators, IEEE 1997, pp. 637-640.

\* cited by examiner

*Primary Examiner* — Thomas L Dickey
*Assistant Examiner* — Nikolay Yushin
(74) *Attorney, Agent, or Firm* — Meschkow & Gresham, P.L.C.

(57) ABSTRACT

A microelectromechanical systems (MEMS) device (20) includes a polysilicon structural layer (46) having movable microstructures (28) formed therein and suspended above a substrate (22). Isolation trenches (56) extend through the layer (46) such that the microstructures (28) are laterally anchored to the isolation trenches (56). A sacrificial layer (22) is formed overlying the substrate (22), and the structural layer (46) is formed overlying the sacrificial layer (22). The isolation trenches (56) are formed by etching through the polysilicon structural layer (46) and depositing a nitride (72), such as silicon-rich nitride, in the trenches (56). The microstructures (28) are then formed in the structural layer (46), and electrical connections (30) are formed over the isolation trenches (56). The sacrificial layer (22) is subsequently removed to form the MEMS device (20) having the isolated microstructures (28) spaced apart from the substrate (22).

10 Claims, 12 Drawing Sheets

METHOD OF PRODUCING MICROELECTROMECHANICAL DEVICE WITH ISOLATED MICROSTRUCTURES

TECHNICAL FIELD OF THE INVENTION

The present invention relates generally to microelectromechanical systems (MEMS) devices. More specifically, the present invention relates to producing MEMS devices having isolated microstructures and high aspect ratio surface micromachining.

BACKGROUND OF THE INVENTION

Microelectromechanical systems (MEMS) refers to a technology that integrates micromechanical structures (referred to hereinafter as microstructures) and microelectronic circuits on the same substrate to create an integrated device. MEMS devices are utilized in, for example, pressure sensing, acceleration sensing, inertial sensing, switches, motors, and the like. While the microelectronic circuits are fabricated using integrated circuit (IC) process sequences (e.g., CMOS, Bipolar, or BICMOS processes), the microstructures are fabricated using compatible "micromachining" processes.

The choice of materials and fabrication processes for implementing MEMS technology depends on the device being created and the market sector in which it will operate. Typical micromachining processes that may be employed for fabricating the microstructures include, for example, surface micromachining and bulk micromachining. In surface micromachining, the MEMS device is fabricated by depositing a sacrificial layer onto a substrate. A layer of polysilicon, as the structural micromechanical material, is then deposited over the sacrificial layer and is etched to yield a desired shape for the particular microstructures. The layer of sacrificial material underlying the polysilicon may then be etched to open up passageways or clearances between moving parts of the microstructures. Thus, surface micromachining is based on the deposition and etching of different structural layers on top of the substrate. In contrast, bulk micromachining defines structures by selectively etching directly into a silicon wafer to produce the mechanical microstructures from the single crystal silicon itself.

Conventional MEMS capacitive sensors operate so that a flexibly mounted seismic mass, also known as a proof mass, is deflectable in at least one direction by a property being sensed, e.g., acceleration. Deflection of the proof mass causes a change in capacitance of a differential circuit that is connected to it. This change in capacitance is a measure of the property being sensed. The aspect ratio of a mechanical microstructure is the ratio of its height relative to its lateral width. A high aspect ratio microstructure can advantageously provide the benefits of increased sense capacitance and reduced cross-axis sensitivity in a MEMS capacitive sensing device.

Bulk micromachining processes can be used to produce these high aspect ratio microstructures. However, bulk micromachining tends to be more limited and more costly than surface micromachining.

In surface micromachining, the use of polysilicon build up layers increases the design freedom for integration of complicated, movable microstructure features. Design freedom includes many more possible layers that can be achieved, relative to bulk micromachining. However, the polysilicon build up layers can be limited in thickness due to residual stress, thus making the thin film layers flexible out of the plane of fabrication. Stress can cause cracks, de-lamination, and voids. In addition, stress results in mismatch of coefficient of thermal expansion and non-uniform deformation. Thus, stress can decrease the longevity of a component and can cause malfunctioning during normal operation. Accordingly, it is difficult to achieve a desired high aspect ratio using a surface micromachining process.

As micromachined devices increase in complexity it becomes increasingly important to improve their electrical flexibility. One approach to improving electrical flexibility is to provide electrical isolation between the various microstructure elements that are still mechanically one piece and to provide electrical isolation from the microelectronic circuits in order to enhance the performance of the MEMS device. In bulk micromachining, electrical isolation has been accomplished by separating conducting metal layers by insulating dielectric layers and through the implementation of trench isolation structures separating laterally adjacent microstructures. However, electrical isolation techniques implemented in bulk micromachining processes cannot be readily implemented in a surface micromachining process.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

Embodiments of the invention entail a microelectromechanical (MEMS) device that includes multiple isolated micromechanical structures (referred to herein as microstructures) and methodology for producing the MEMS device. The methodology produces a high aspect ratio polysilicon structural layer of microstructures utilizing a surface micromachining process. Isolation trenches are formed between the microstructures to provide lateral electrical and mechanical stress isolation to significantly reduce capacitance offsets due to temperature coefficient mismatch and substrate twisting or bending. Moreover, implementation of the methodology yields high performance and low cost MEMS device architectures.

Figure 1:
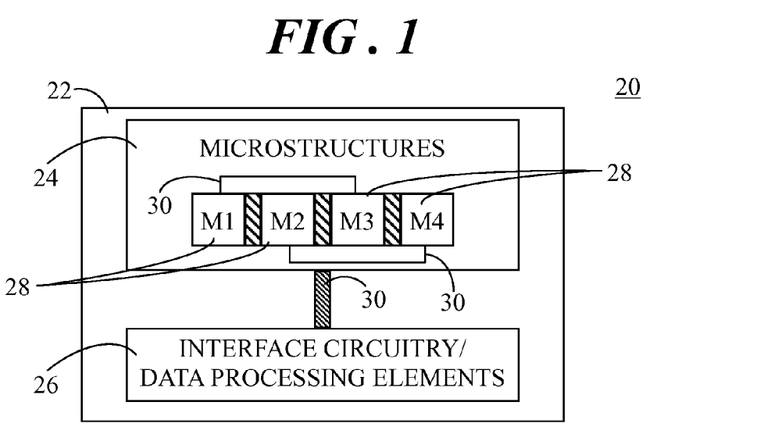
FIG. 1 shows a block diagram of a microelectromechanical systems (MEMS) device disposed on a substrate.

FIG. 1 shows a block diagram of a microelectromechanical systems (MEMS) device 20 disposed on a substrate 22 in one exemplary embodiment. MEMS device 20 includes a structure region 24 and a circuit region 26, disposed on substrate 22, e.g., a silicon substrate.

Structure region 24 includes machined micromechanical structures, e.g., microstructures 28, labeled M1, M2, M3, M4. Circuit region 26 may include data processing elements and interface circuitry. The data processing elements may process and analyze information generated by (e.g., a transducer), and/or control or monitor microstructures 28. The interface circuitry may provide the information from microstructures 28 and/or the data processing elements to an external device (not shown). Circuit region 26 is not shown in detail because its circuitry will depend upon the purpose of the device. That is, the circuitry will depend upon whether MEMS device 20 is an angular accelerometer, gyroscope, linear accelerometer, switch, microactuator, and so forth.

The data processing elements and/or interface circuitry of circuit region 26 may be integrated on substrate 22. As such, MEMS device 20 may be a monolithic structure including microstructures 28 of structure region 24 as well as the data processing elements and/or interface circuitry of circuit region 26. However, data processing elements and/or interface circuitry of circuit region 26 may alternatively reside on a separate, discrete substrate that, after fabrication, may be bonded to substrate 22.

Microstructures 28 in structure region 24 may be electrically connected to circuit region 26 by conductive electrical connections 30. Particular ones of microstructures 28 may additionally be electrically connected with one another by electrical connections 30, as will be discussed below. Electrical connections 30 may be formed of polysilicon or a metal such as aluminum, copper, or tungsten. Although, only four microstructures 28 (M1, M2, M3, M4) are represented herein, it should be understood that MEMS device 20 can include any number of microstructures 28 in accordance with the purpose of the device.

Figure 2:
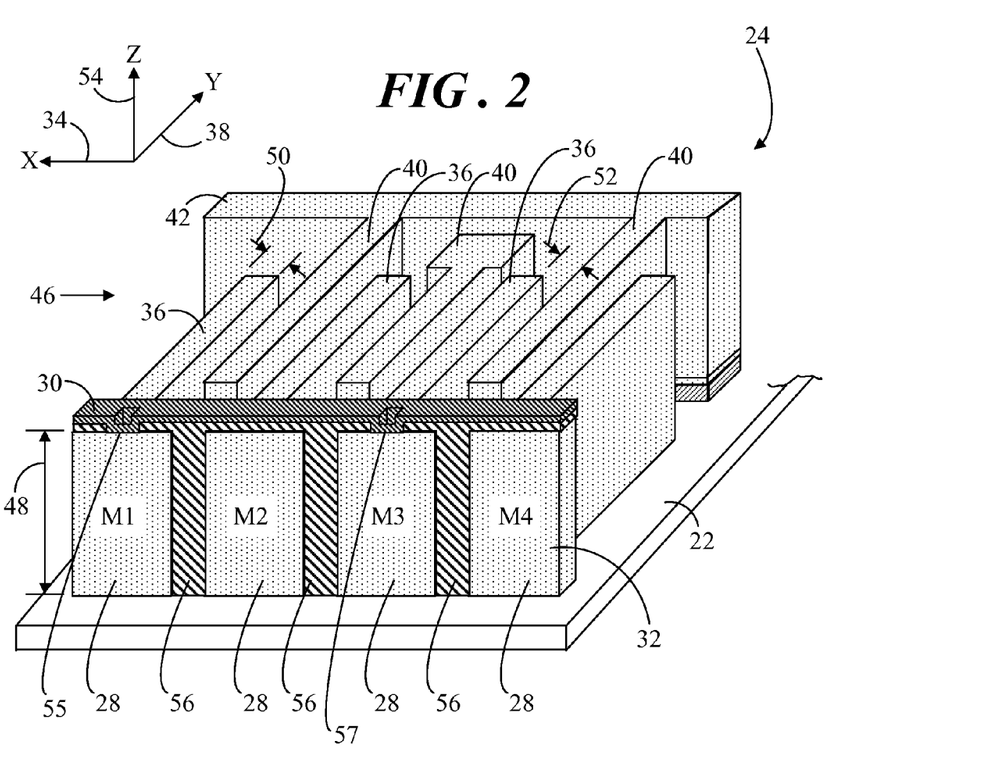
FIG. 2 shows a perspective view of a portion of a number of microstructures that may be included in the MEMS device.

FIG. 2 shows a perspective view of a portion of a number of microstructures 28 that may be included in structure region 24 of MEMS device 20. The illustrated MEMS device 20 is a linear accelerometer. However, the principles of the invention are applicable to many other MEMS devices, such as angular accelerometers, gyroscopes, microactuators, pressure sensors, switches, and the so forth.

In an embodiment, MEMS device 20 includes a proof mass 32 which is anchored to substrate 22 by flexures (not shown). As is known in the art, the flexures are designed to suspend proof mass 32 spaced apart from the underlying substrate 22 and to permit proof mass 32 to move along the X-axis, represented by an arrow 34, substantially parallel to the surface of substrate 22. A plurality of movable beams 36, sometimes referred to as movable electrode fingers, project from proof mass 32 substantially parallel to the Y-axis, represented by an arrow 38. A plurality of fixed beams 40, also referred to as fixed electrode fingers, extend from a fixed frame 42 and are anchored to embedded electrical connections (not visible) disposed on substrate 22. Fixed beams 40 may be excitation/drive electrodes and project inwardly substantially parallel to Y-axis 38. As such, each of movable beams 36 is positioned between a pair of fixed beams 40.

Proof mass 32 with movable beams 36 and fixed frame 42 with fixed beams 40 are formed in a polysilicon structural layer 46. Polysilicon structure layer 46, hence microstructures 28, exhibits a height 48. In an embodiment, height 48 may be approximately twenty five microns. However, a preferred height 48 is determined by the application and desired sensitivity. In addition, beams 36 and 40 exhibit a width 50, and a gap between movable beams 36 and fixed beams 40 exhibits a width 52. Width 50 and 52 may be less than five microns, e.g., approximately two microns. Again, preferred widths 50 and 52 are determined by the application and desired sensitivity.

When width 50 is approximately two microns, beams 36 and 40 have a high aspect ratio (a ratio of height 48 to width 50) of 12:1 in this exemplary embodiment. Likewise, when width 52 is approximately two microns, the gap between movable beams 36 and fixed beams 40 has a high aspect ratio (the ratio of height to width 52) of 12:1.

The high aspect ratio provides an increase in surface area between beams 36 and 40, and thus a larger sense capacitance. The increased sense capacitance also provides an increased signal-to-noise ratio. In addition, the high vertical aspect ratio of microstructures 28 yields a relatively larger mass and larger moment of inertia, and consequently reduced thermal noise. Furthermore, the high vertical aspect ratio yields microstructures 28 that are more rigid relative to the Z-axis, represented by an arrow 54, and are thus less likely to move out of the plane of fabrication.

In an embodiment, proof mass 32 includes isolation trenches 56 extending entirely through height 48 of polysilicon structural layer 46. A portion of proof mass 32, laterally anchored to at least one of isolation tranches 56, and a corresponding one of movable beams 36 extending from that portion of proof mass 32 forms one of microstructures 28. Isolation trenches 56 are filled with an insulating material. In an embodiment, this insulating material is a nitride, such as silicon nitride. Accordingly, isolation trenches 56 electrically isolate microstructures 28 from one another. Furthermore, isolation trenches 56 provide mechanical stress isolation between laterally adjacent microstructures, as will be discussed in greater detail below.

In addition, isolation trenches 56 can provide a bridge to support electrical contacts, e.g., electrical connections 30, between certain microstructures 28 and to circuit region 26 (FIG. 1). By way of example, a first one of microstructures 28, labeled M1, is electrically connected to another one of microstructures 28, labeled M3, via electrical connections 30. More specifically, a conduction path is provided by electrical connections 30 through polysilicon structural layer 46 of first microstructure 28, M1, and polysilicon structural layer 46 of second microstructure 28, M3, via contact regions 55 and 57. Current flows, for example, from microstructure 28, M1, through contact region 55, through electrical connection 30, back through contact 57, through microstructure 28, M3, and so forth. However, microstructures 28, labeled M2 and M4, are isolated from the conduction path by isolation trenches 56 and an insulating layer 59 sandwiched between microstructures 28, M2 and M4, and electrical connection 30.

Figure 3:
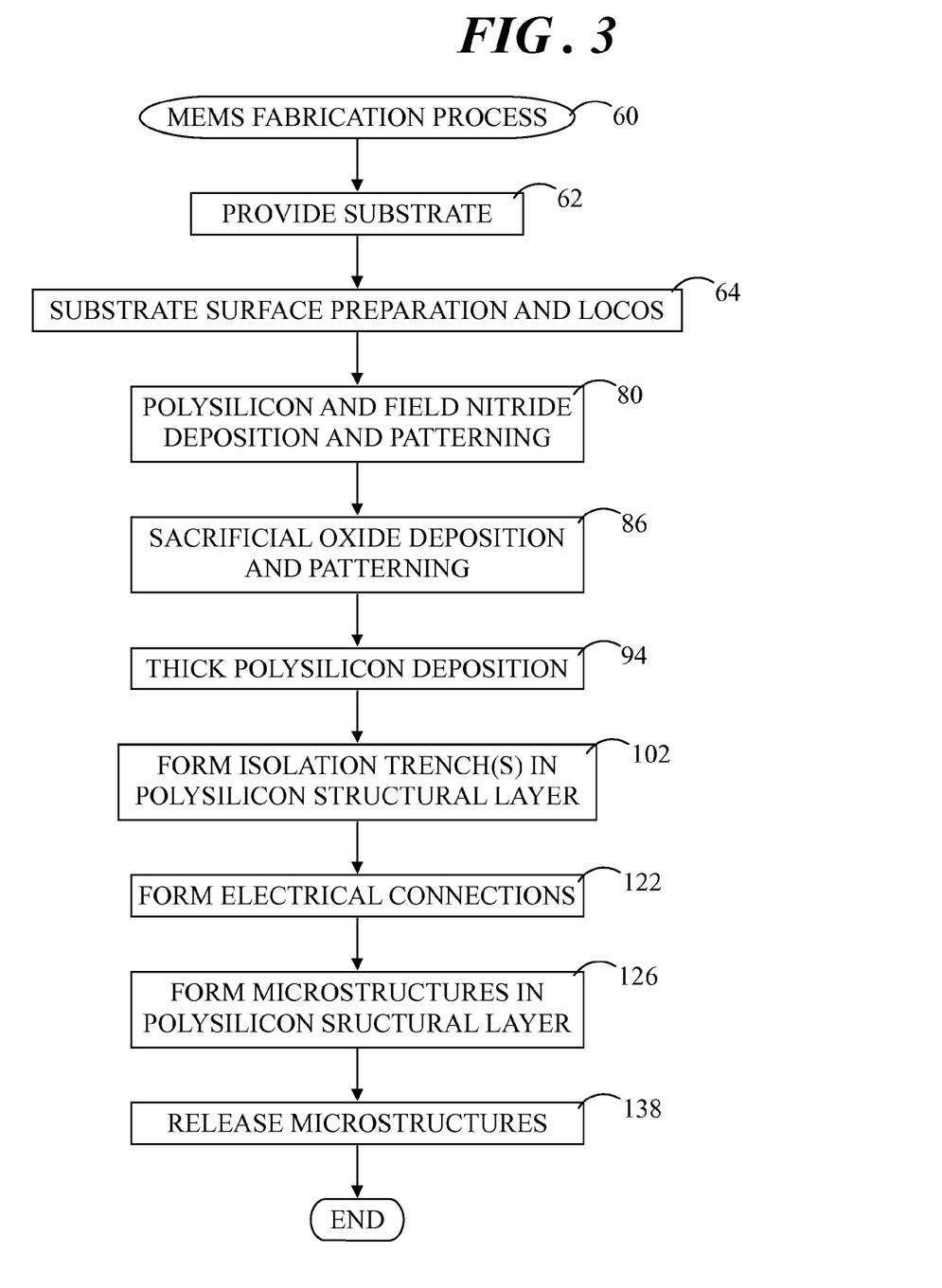
FIG. 3 shows a flowchart of a fabrication process for producing the MEMS device.

FIG. 3 shows a flowchart of a fabrication process 60 for producing MEMS device 20. Fabrication process 60 takes advantage of surface micromachining techniques to produce the high aspect ratio MEMS device 20 with isolated microstructures 28. FIGS. 4-26 show schematic cross-sectional views illustrating operations of the fabrication process of FIG. 3. The operations of fabrication process 60 will be discussed in connection with FIGS. 4-26. As such, throughout discussion of the operations of fabrication process 60, reference will be made to particular ones of FIGS. 4-26.

Although a number of variations of the invention are possible, the basic process is illustrated in FIGS. 4-26 which show only a few isolated microstructures 28 having beams, i.e., movable beams 36 (FIG. 2), fabricated on substrate 22. It should be understood, however, that structure region 24 of an entire MEMS device 20 may be composed of any number of such microstructures 28, connected laterally to isolation trenches 56 in accordance with device functionality.

Fabrication process 60 begins with a task 62. At task 62, substrate 22 is provided. In an embodiment, substrate 22 is a silicon wafer. However, since fabrication process 60 employs a surface micromachining technique in which the microstructures 28 are built on top of substrate and not inside it (such as in bulk micromachining), the substrate's properties are not as critical. Consequently, substrate 22 may alternatively be formed from a less costly material such as glass or plastic. The following operations of fabrication process 60 describe operations for fabricating the isolated microstructures 28 of structure region 24 for a single MEMS device 20 (FIG. 1). However, in accordance with fabrication processes, a plurality of MEMS devices 20, including both structure region 24 (FIG. 1) and circuit region 26 (FIG. 1), may be produced on substrate 22 concurrently.

Figure 4:
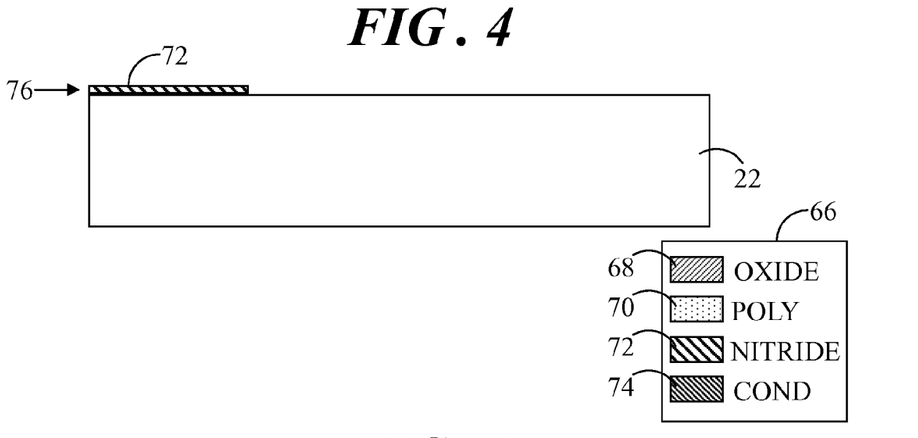
FIG. 4 shows a schematic cross-sectional view illustrating an operation of the fabrication process of FIG. 3.
Figure 5:
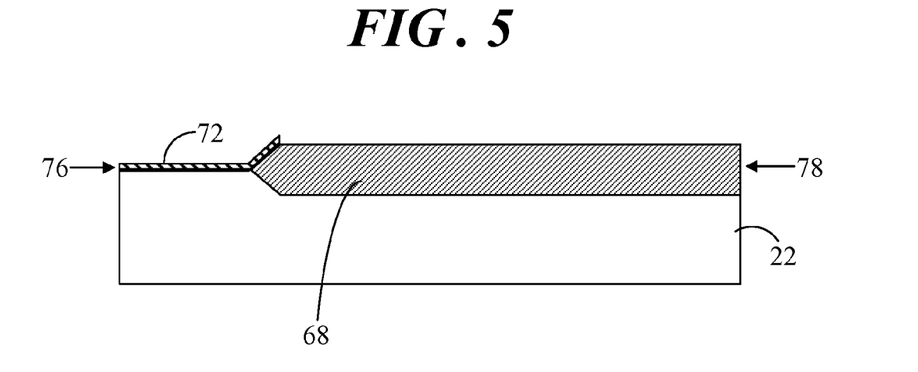
FIG. 5 shows a schematic cross-sectional view illustrating another operation of the fabrication process of FIG. 3.
Figure 6:
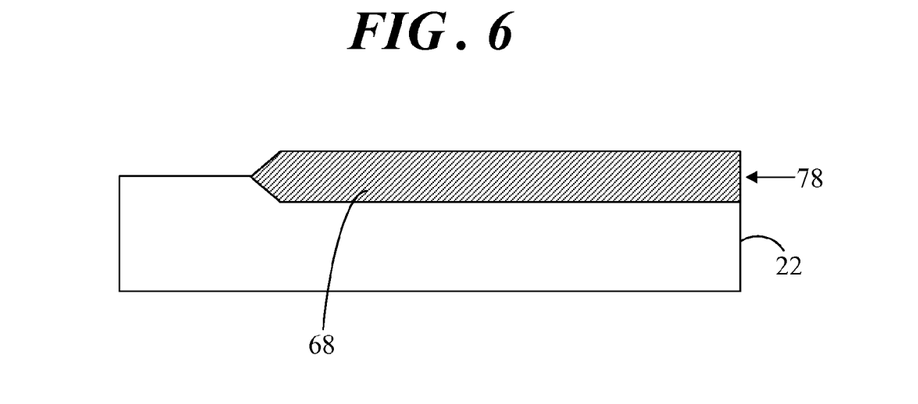
FIG. 6 shows a schematic cross-sectional view illustrating another operation of the fabrication process of FIG. 3.

Fabrication process 60 continues with a task 64. At task 64, surface preparation of substrate 22 is performed and a local oxidation of silicon (LOCOS) process is performed per convention. Referring to FIGS. 4-6, FIGS. 4-6 illustrate operations occurring at task 64 of fabrication process 60. A legend 66 is associated with FIG. 4.

Legend 66 provides a list of the particular patterns used throughout FIGS. 1, 2, and 4-26 to represent the various materials utilized in the fabrication of microstructures 28. Thus, a first pattern 68 represents an oxide, such as silicon dioxide. A second pattern 70 represents polycrystalline silicon (usually referred to as polysilicon). A third pattern 72 represents a nitride, such as silicon nitride or silicon-rich nitride. A fourth pattern 74 represents a conductive material (such as doped silicon, doped germanium, or one of various metals, i.e. aluminum, copper, molybdenum, tantalum, titanium, nickel, tungsten, and the like). Accordingly, in some embodiments, the oxide may be implemented with silicon dioxide and the nitride may implemented with silicon nitride or silicon-rich nitride. For clarity of description, oxide is referred to hereinafter as oxide 68. Likewise, nitride is referred to hereinafter as nitride 70. Polycrystalline silicon is referred to hereinafter as polysilicon 70, and the conductive material is referred to hereinafter as conductive material 74.

In FIG. 4, fabrication begins with cleaning of substrate 22. Next, a thermal oxidation process may be performed to produce an oxide pad (not shown) overlying substrate 22. This oxide pad, also known as a buffer oxide, is a stress relief layer and may have a deposition thickness of approximately fifty nanometers. Next, nitride 72 may be deposited on substrate 22. Nitride 72, such as silicon nitride, may be deposited using low-pressure chemical vapor deposition (LPCVD) or plasma enhanced chemical vapor deposition (PECVD) to provide a nitride layer over substrate 22 at a thickness of, for example, approximately one hundred forty nanometers. A pattern may be transferred onto nitride 72 using photolithography. This pattern is then etched into nitride 72 using, for example, reactive ion etching (RIE) to produce a nitride mask layer 76.

In FIG. 5, a thermal field oxidation process is performed to produce a field oxide layer 78 of oxide 68 on substrate 22. Field oxide layer 78 of oxide 68 may have a thickness of approximately two thousand to three thousand nanometers. During the growth of field oxide layer 78, nitride mask layer 76 is pushed upward along the junction of field oxide layer 78 and nitride mask layer 76. In FIG. 6, a nitride strip process is performed to remove any oxy-nitride and nitride 72 of nitride mask layer 76 to leave remaining field oxide layer 78 on substrate 22. Field oxide layer 78 forms an immersed insulating barrier on substrate 22 to limit cross-talk between active devices built on field oxide layer 78. Although a thermal field oxidation process is discussed herein, it should be understood that other processes may be used to produce field oxide layer 78 in alternative embodiments.

Figure 7:
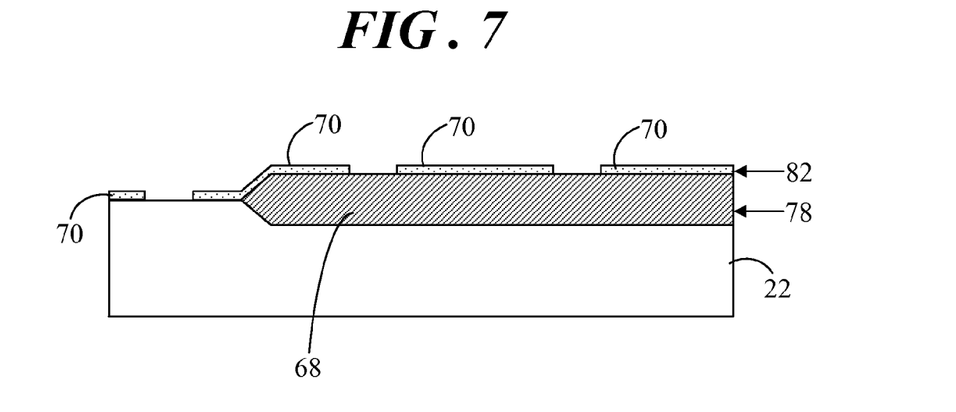
FIG. 7 shows a schematic cross-sectional view illustrating another operation of the fabrication process of FIG. 3.
Figure 8:
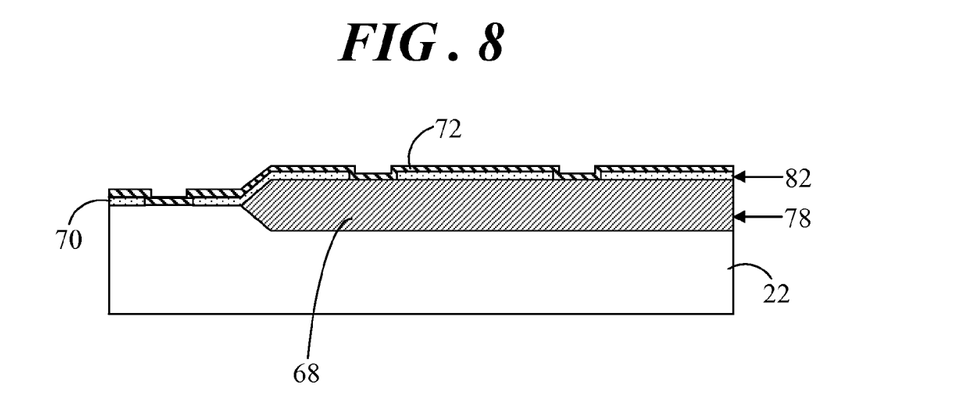
FIG. 8 shows a schematic cross-sectional view illustrating another operation of the fabrication process of FIG. 3.
Figure 9:
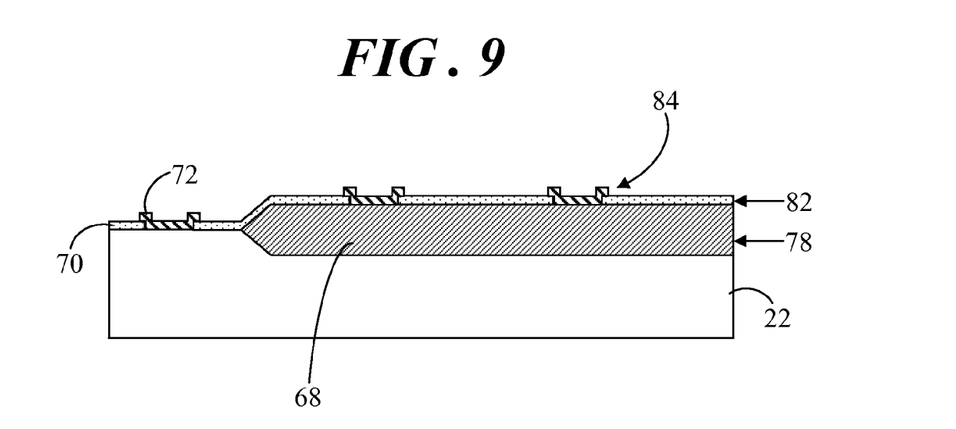
FIG. 9 shows a schematic cross-sectional view illustrating another operation of the fabrication process of FIG. 3.

Referring back to FIG. 3, following task 64, a task 80 is performed. At task 80, a polysilicon layer and a nitride layer are deposited and patterned. FIGS. 7-9 illustrate operations occurring at task 80 of fabrication process 60. In FIG. 7, polysilicon 70 is deposited over substrate 22 and field oxide layer 78. Polysilicon 70 may have a deposition thickness of approximately three hundred to five hundred nanometers. Polysilicon 70 may be patterned using, for example, a photolithographic process, and etched using, for example, reactive ion etching (RIE), to produce a patterned polysilicon layer 82. A high conductivity is desired for polysilicon layer 82 in some embodiments. Hence, polysilicon layer 82 may be doped over the entire surface area, or may otherwise be made highly conductive. After patterning and etching, polysilicon layer 82 can yield buried polysilicon conductor regions.

In FIG. 8, nitride 72 is deposited over polysilicon layer 82 as well as exposed portions of substrate 22 and field oxide layer 78. Nitride 72 may have a deposition thickness of approximately three hundred to six hundred nanometers. In FIG. 9, nitride 72 is patterned using, for example, a photolithographic process, and etched using, for example, RIE, to produce a patterned nitride layer 84. Nitride layer 84 insulates various regions of polysilicon layer 82 from one another.

Figure 10:
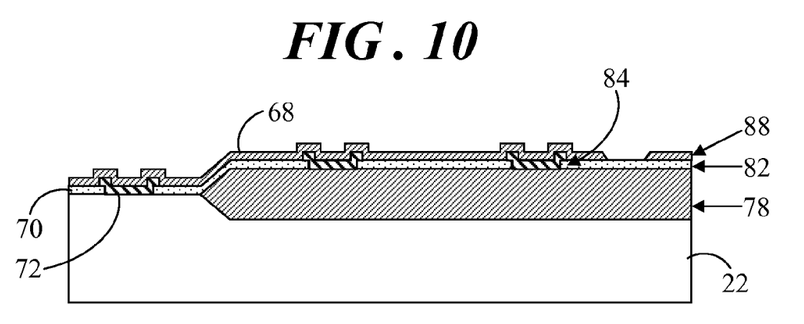
FIG. 10 shows a schematic cross-sectional view illustrating another operation of the fabrication process of FIG. 3.
Figure 11:
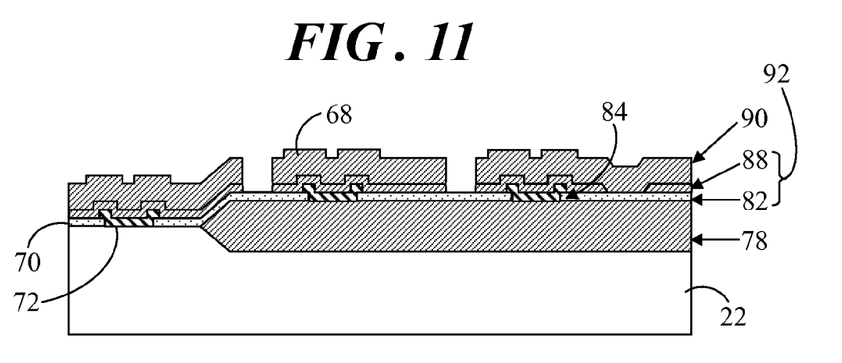
FIG. 11 shows a schematic cross-sectional view illustrating another operation of the fabrication process of FIG. 3.

Referring back to FIG. 3, following task 80, a task 86 is performed. At task 86, a sacrificial oxide is deposited and patterned. FIGS. 10 and 11 illustrate operations occurring at task 86 of fabrication process 60. In FIG. 10, oxide 68 is deposited over field oxide layer 78, polysilicon layer 82, and nitride layer 84 to form a first portion 88 of a sacrificial oxide layer. In an embodiment, first portion 88 of the sacrificial oxide layer may be formed using, for example, a known tetraethyl orthosilicate (TEOS) deposition process. Once deposited, the TEOS is readily converted into silicon dioxide, i.e., oxide 68. First portion 88 of the sacrificial oxide layer may have a deposition thickness of approximately nine hundred nanometers. Oxide 68 of first portion 88 of the sacrificial oxide layer may then be patterned using, for example, a photolithographic process, and etched using, for example, an oxide wet etch process.

In FIG. 11, another layer of oxide 68 is deposited over first portion 88 of the sacrificial oxide layer to form a second portion 90 of the sacrificial oxide layer. Second portion 90 may be formed using a TEOS deposition process and patterned using photolithography and oxide reactive ion etching (RIE). Second portion 90 of the sacrificial oxide layer may have a deposition thickness of approximately 1.65 microns (1650 nanometers). The combined first portion 88 and second portion 90 form a sacrificial oxide layer 92 overlying substrate 22. In the illustrated embodiment, a two layer sacrificial oxide deposition process is performed to achieve satisfactory deposition control. However, such a two layer sacrificial oxide deposition process is not a requirement. In an alternative embodiment, sacrificial oxide layer 92 may be formed using a single layer deposition and patterning technique.

Figure 12:
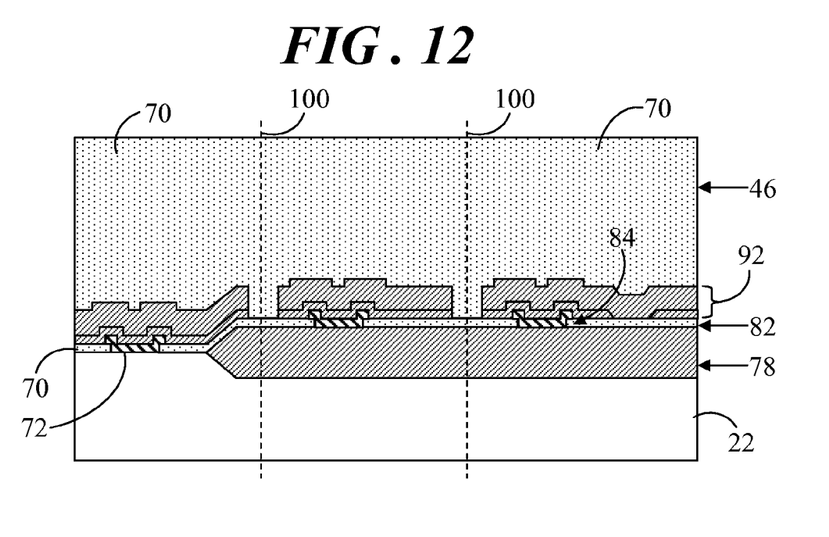
FIG. 12 shows a schematic cross-sectional view illustrating another operation of the fabrication process of FIG. 3.

Referring back to FIG. 3, following task 86, a task 94 is performed. At task 94, thick polysilicon deposition is performed. FIG. 12 illustrates the operations occurring at task 94 of fabrication process 60. In FIG. 12, polysilicon 70 is formed overlying the various structures previously built up on substrate 22 to form polysilicon structural layer 46. Polysilicon structural layer 46 may be formed using various known and upcoming processes for thick film deposition. In one example, a polysilicon starting, or seed, layer may be deposited over a surface of the structure shown in FIG. 12 at a thickness of approximately one hundred to three hundred nanometers. A thick silicon layer may then be deposited over the polysilicon starting layer in another process step at a thickness of approximately 22,000 to 28,000 nanometers.

The thick silicon layer deposition may occur in a conventional single wafer chemical vapor deposition (CVD) reactor. Such a single wafer CVD reactor is an installation for deposition of silicon layers that is typically used in the semiconductor industry for the production of single-crystal silicon layers on a single-crystal silicon substrate. However, in this example embodiment, deposition in the single wafer CVD reactor does not occur on a single-crystal silicon starting layer, but instead occurs on the polycrystalline silicon (i.e., polysilicon) starting layer. As such, no thick single-crystal silicon layer develops, but instead a thick polycrystalline layer, i.e., polysilicon structural layer 46, develops. In another example, a conductive polysilicon seed layer and a conductive thick polysilicon layer are processed consecutively in a single wafer CVD reactor process. Since polysilicon structural layer 46 has a rough surface after this deposition, it is subsequently planarized using, for example, a chemical-mechanical polishing process.

An advantage of CVD is the high growth rate of material, which allows the formation of films with considerable thickness. For example, polysilicon structural layer 46 may have a deposition thickness of approximately thirty microns following deposition. However, following planarization, polysilicon structural layer 46 may exhibit height 48 (FIG. 2) of approximately twenty-five microns. However, a preferred height 48 is determined by the application and desired sensitivity.

FIG. 12 further shows dashed lines 100. Dashed lines 100 delineate that portion of the structure of FIG. 12 that will be shown in FIGS. 13-26 in an enlarged form for clarity of illustration.

Referring back to FIG. 3, following task 94, a task 102 is performed. At task 102, isolation trenches 56 (FIG. 2) are formed in accordance with an embodiment of the invention. FIGS. 13-20 illustrate the operations occurring at task 102 of fabrication process 60.

Figure 13:
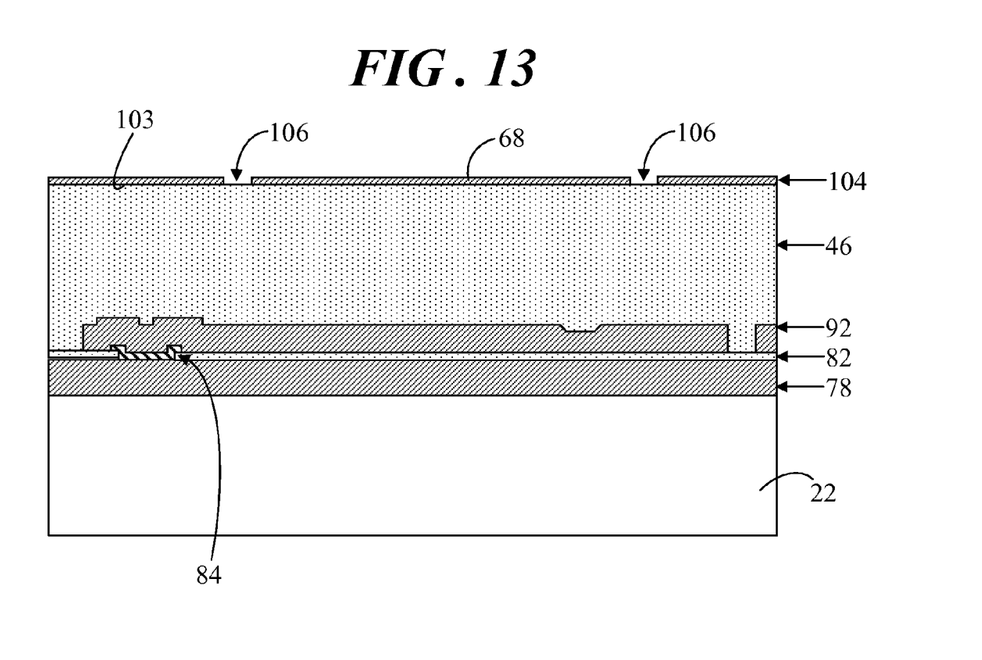
FIG. 13 shows a schematic cross-sectional view illustrating another operation of the fabrication process of FIG. 3.

In FIG. 13, oxide 68 is deposited over a top surface 103 of polysilicon structural layer 46 and patterned to form a mask 104. In an embodiment, mask 104 may be formed by a TEOS deposition process in which the TEOS is converted to an oxide to form mask 104. Mask 104 may have a deposition thickness of approximately six hundred and thirty nanometers. A photolithographic process and oxide RIE may be performed to produce openings 106 in mask 104 in accordance with an etch pattern thus exposing polysilicon structural layer 46 at openings 106.

Figure 14:
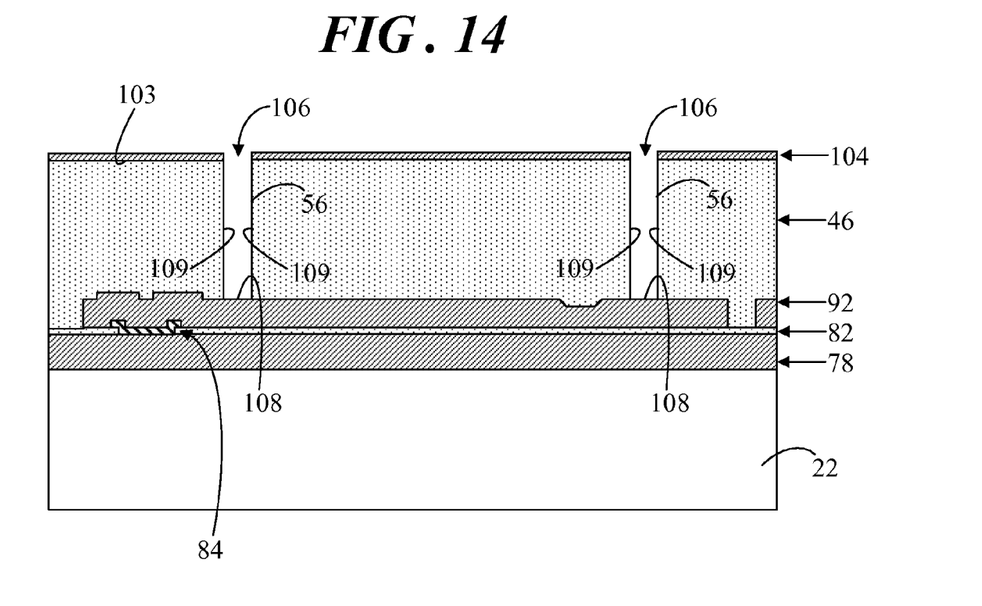
FIG. 14 shows a schematic cross-sectional view illustrating another operation of the fabrication process of FIG. 3.

In FIG. 14, isolation trenches 56 are formed in polysilicon structural layer 46 through openings 106. In an embodiment, trenches 56 may be formed by etching through polysilicon structural layer 46 using, for example, polysilicon deep reactive-ion etching (DRIE). DRIE is a highly anisotropic etch process used to create deep, steep-sided holes and trenches in a material with an aspect ratio of 20:1 or more. Etch depths for DRIE can be up to six hundred microns or more with rates up to twenty microns per minute, versus etch depths for RIE that are limited to approximately ten microns at a rate of up to one micron per minute. The entire thickness of polysilicon structural layer 46 is etched through to expose an underlying portion 108 of sacrificial layer 92 and to form sidewalls 109 of trenches 56 in polysilicon structural layer 46.

Figure 15:
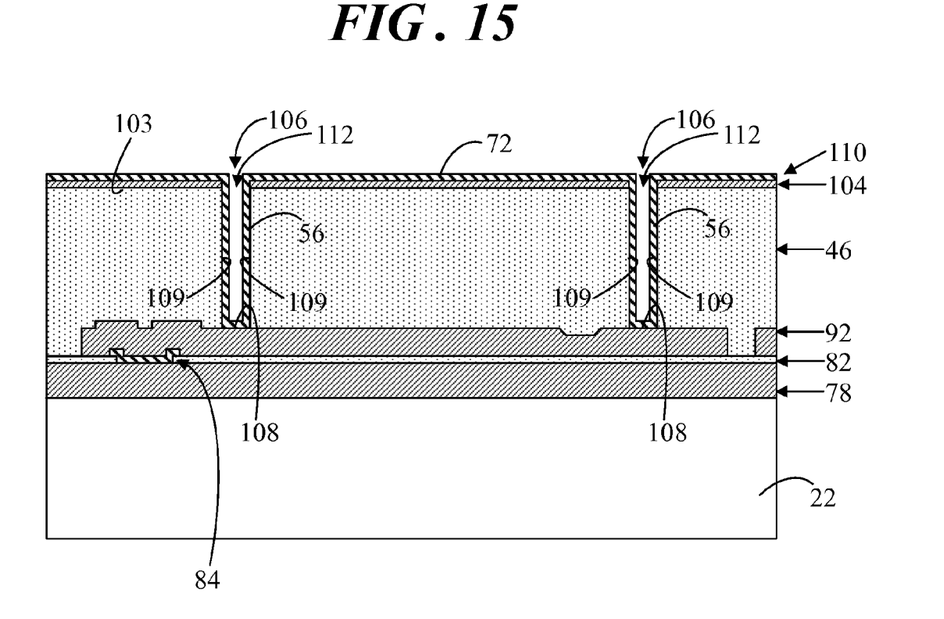
FIG. 15 shows a schematic cross-sectional view illustrating another operation of the fabrication process of FIG. 3.

In FIG. 15, an insulating film is deposited in trenches 56 and overlying oxide mask 104. In an embodiment, nitride 72 in the form of a nitride film 110 may be deposited (with a pre-deposition clean) using a low-pressure chemical vapor deposition (LPCVD) process. Nitride film 110 lines sidewalls 109 in trenches 56, as well as underlying portion 108 of sacrificial layer 92. Nitride film may have a deposition thickness of approximately six hundred nanometers to form sub-trenches 112 (i.e., smaller trenches) in each of trenches 56.

Figure 16:
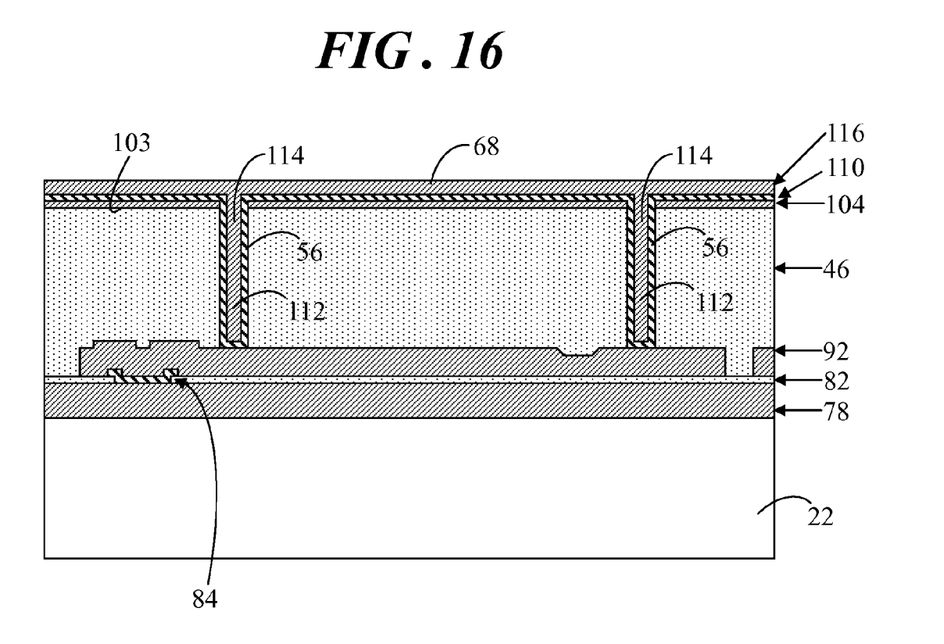
FIG. 16 shows a schematic cross-sectional view illustrating another operation of the fabrication process of FIG. 3.

In FIG. 16, a sacrificial oxide plug 114 is deposited in each of sub-trenches 112. In an embodiment, oxide 68 may be deposited by Sub-Atmospheric (pressure) Chemical Vapor Deposition (SA CVD). Oxide 68 entirely files sub-trenches 112 and concurrently deposits an oxide layer 116 on nitride film 110 overlying mask 104. Sacrificial oxide plugs 114 protect nitride film 110 lining trenches 56 from later process operations.

Figure 17:
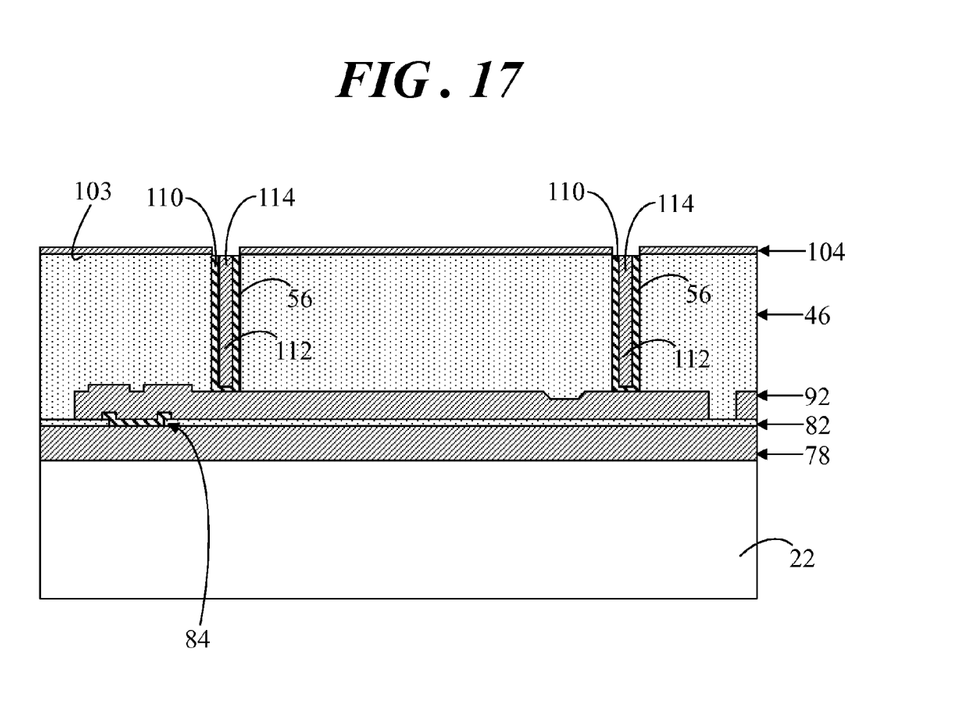
FIG. 17 shows a schematic cross-sectional view illustrating another operation of the fabrication process of FIG. 3.

In FIG. 17, an oxide/nitride RIE etch back process is performed to remove oxide layer 116 and nitride film 10 from mask 104. As such, only sacrificial plugs 114 remain in sub-trenches 112 to protect nitride film 110 in trenches 56.

Figure 18:
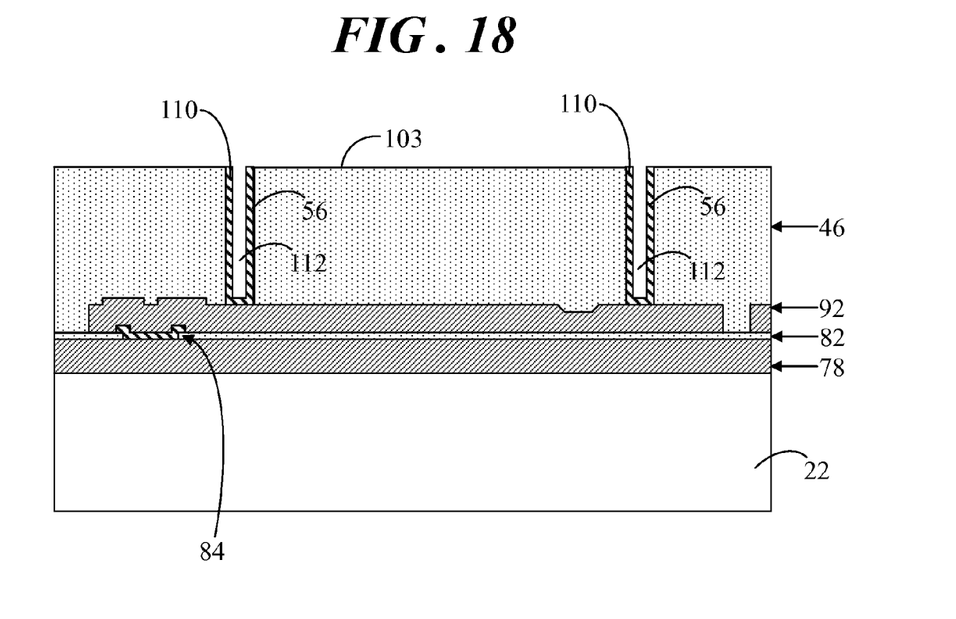
FIG. 18 shows a schematic cross-sectional view illustrating another operation of the fabrication process of FIG. 3.

In FIG. 18, residual oxide is removed using a buffered oxide etch (BOE). BOE is a wet etchant primarily for use in etching thin films of, for example, silicon dioxide. BOE includes a mixture of a buffering agent, such as ammonium fluoride and hydrofluoric acid. The inclusion of a buffering agent in the mixture provides for more controllable etching so that in this instance nitride film 110 and polysilicon structural layer 46 will not be compromised during BOE. Mask 104 (shown in FIG. 17) is removed to expose top surface 103 of polysilicon structural layer 46. Additionally, through the buffered oxide etch process, sacrificial plugs 114 (shown in FIG. 17) are removed from sub-trenches 112. Thus, sacrificial plugs 114 protected nitride film 110 through the various etching operations until those operations were complete. Subsequently, mask 104 and sacrificial plugs 114 were removed with both top surface 103 of polysilicon structural layer 46 and nitride film 110 lining trenches 56 remaining intact.

Figure 19:
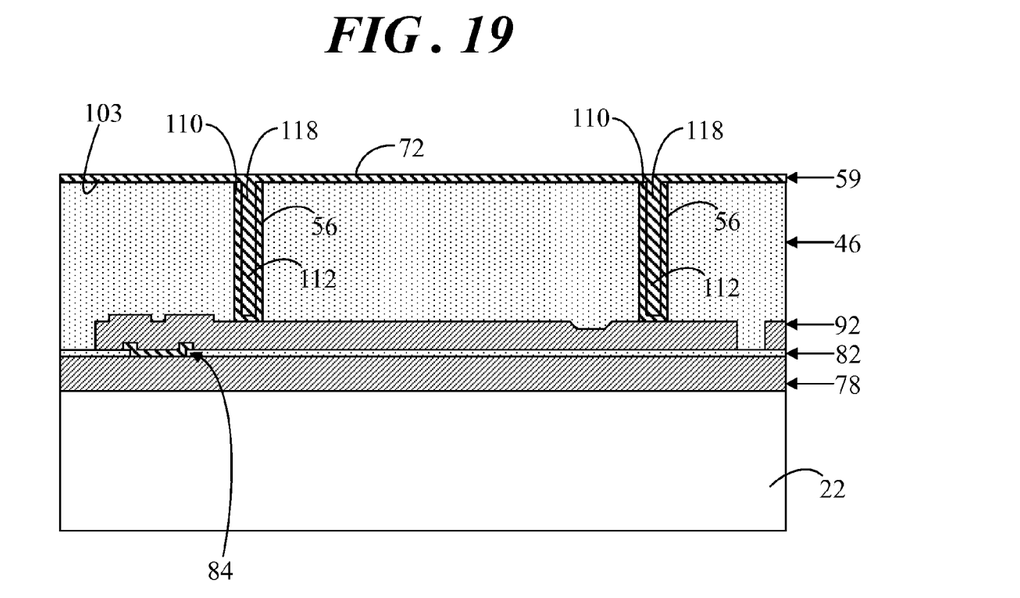
FIG. 19 shows a schematic cross-sectional view illustrating another operation of the fabrication process of FIG. 3.

In FIG. 19, nitride plugs 118 are formed in sub-trenches 112 and nitride insulating layer 59 is formed on top surface 103 of polysilicon structural layer 46. That is, sub-trenches 112 are filled with nitride 72. Concurrently, nitride 72 is deposited on top surface 103 of polysilicon structural layer 46. Deposition of nitride 72 in sub-trenches 112 and on top surface 103 may be performed using LPCVD to entirely fill sub-trenches 112 and to form a deposition thickness of nitride insulating layer 59 of approximately six hundred nanometers on top surface 103.

Figure 20:
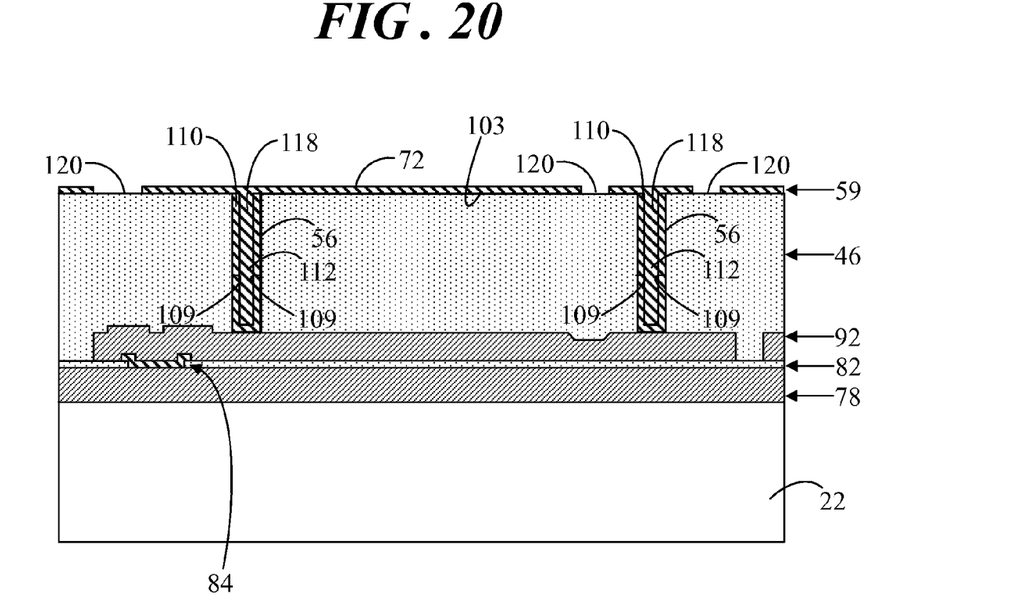
FIG. 20 shows a schematic cross-sectional view illustrating another operation of the fabrication process of FIG. 3.

In FIG. 20, nitride 72 deposited on top surface is patterned using, for example, a photolithographic process, and etched using, for example RIE, to produce a pattern in nitride insulating layer 59. Nitride insulating layer 59 insulates various regions of top surface 103 of polysilicon structural layer 46 from one another. In addition, the etching of nitride insulating layer 59 can result in the exposure of regions 120 of top surface 103 of polysilicon structural layer 46 that will be utilized for interconnection with electrical connections 30 (FIG. 2) in accordance with the particular design and function of MEMS device 20 (FIG. 1). That is, regions 120 of top surface 103 are interconnect regions at which conductive material 74 (FIG. 4) may be deposited for the contacts 55 and 57 (FIG. 2) of electrical connections 30.

In an embodiment, nitride plugs 118 and nitride insulating layer 59 are formed from silicon-rich silicon nitride. The dual nitride deposition operations in isolation trenches 56 and the use of silicon-rich nitride offer several advantages. The dual nitride deposition processes enable more controlled thickness of nitride 72 and define the thickness of nitride 72 in nitride insulating layer 59. Regarding the use of silicon-rich silicon nitride, stoichiometric silicon nitride, $Si_3N_4$, experiences strong tensile stress. This tensile stress can crack nitride films that are thicker than two hundred nanometers. The silicon-rich nitride, deposited by LPCVD, includes more silicon and less nitrogen. Silicon-rich nitride is a low stress amorphous material with a high refractive index. The use of silicon-rich nitride in nitride film 110 and nitride plugs 118 can provide stress relief between laterally adjacent microstructures 28 and provide better adhesion to polysilicon structural layer 46 than stoichiometric silicon nitride.

In an embodiment, the silicon-rich nitride used for nitride film 110 and/or nitride plugs 118 exhibits an index of refraction (R) of 2 to 2.5. The index of refraction of a material is a measure for how much the speed of light (or other waves such as sound waves) is reduced inside that material. In connection with silicon-rich nitride, the index of refraction generally increases linearly with increasing silicon content. As such, the index of refraction of a silicon-rich nitride can be used as an indication of the silicon content of the silicon-rich nitride. At an index of refraction less than 2, the silicon-rich nitride may not have enough silicon in it to enhance adhesive properties of the material to polysilicon structural layer 46. Conversely, increasing the silicon content of the silicon-rich nitride so that the index of refraction is greater than 2.5 can undesirably increase or enhance the conductivity of the silicon-rich nitride. Therefore, it would not serve in its capacity as an insulating material within isolation trenches 56. Consequently, silicon-rich nitride having an index of refraction in the range of 2 to 2.5 can yield a material with the desired adhesive properties with a negligible conductivity increase relative to stoichiometric silicon nitride ($Si_3N_4$).

Accordingly, the dual nitride deposition processes using a silicon-rich nitride with a refractive index of 2 to 2.5 can provide an insulating material in which deposition thickness can be readily controlled. In addition, the dual nitride deposition processes using a silicon-rich nitride has a lower likelihood of material cracking and with better adhesion to the polysilicon sidewalls 109 of isolation trenches 56.

Figure 21:
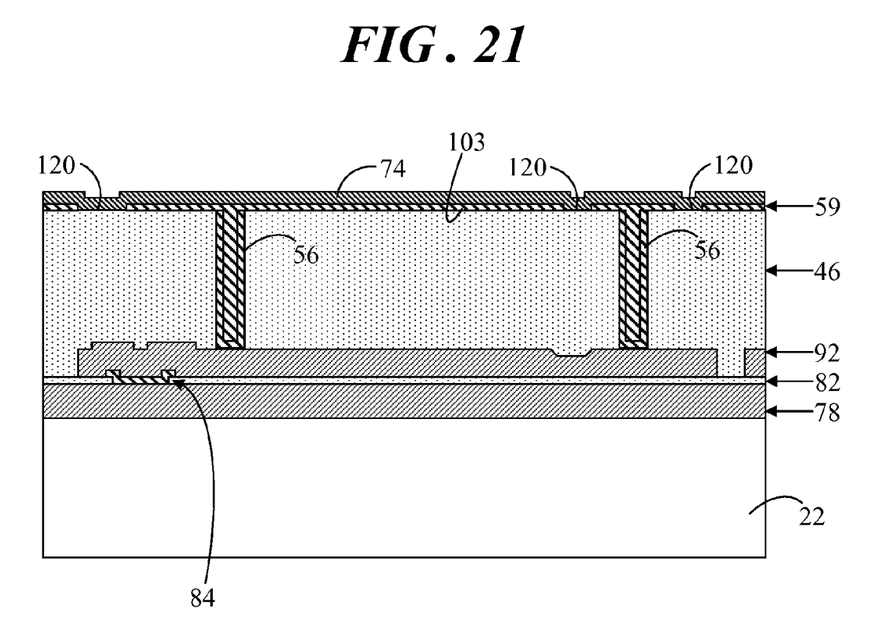
FIG. 21 shows a schematic cross-sectional view illustrating another operation of the fabrication process of FIG. 3.
Figure 22:
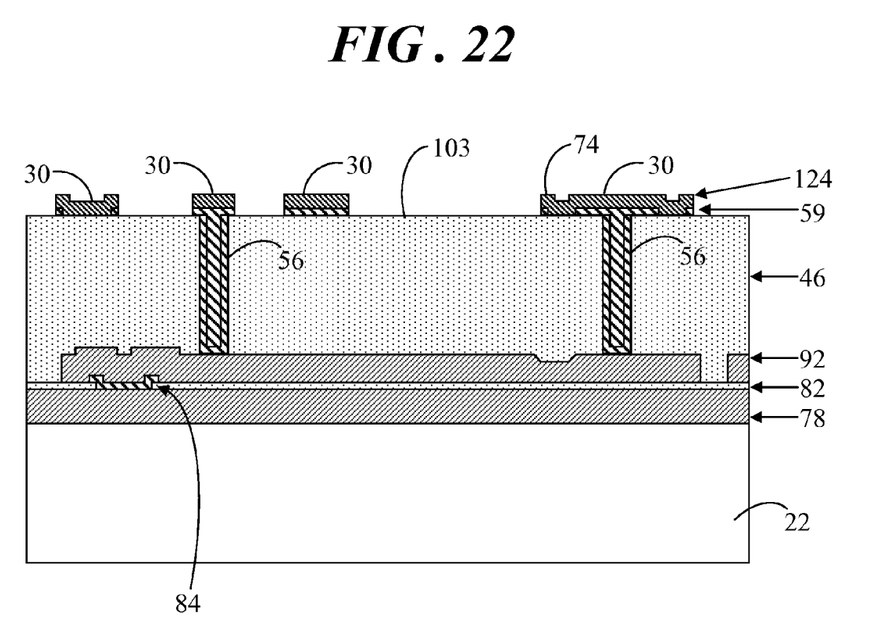
FIG. 22 shows a schematic cross-sectional view illustrating another operation of the fabrication process of FIG. 3.

Referring back to FIG. 3, following task 102, a task 122 is performed. At task 122, electrical contacts, such as electrical connections 30 (FIG. 2), are formed. FIGS. 21 and 22 illustrate the operations occurring at task 122 of fabrication process 60. In FIG. 21, conductive material 74 is deposited over nitride insulating layer 59 and over the exposed regions 120 of polysilicon structural layer 46. In an embodiment, conductive material 74 may have a deposition thickness of approximately 0.3 to 1.2 microns. Furthermore, as mentioned above, conductive material 74 may be doped silicon, doped germanium, or one of various metals, (i.e. aluminum, copper, molybdenum, tantalum, titanium, nickel, tungsten), or any other suitably conductive material.

In FIG. 22, conductive material 74 is patterned and etched to leave a structured conductive material layer 124 remaining. Conductive material 74 may be patterned using, for example, a photolithographic process, and etched using, for example, RIE, to produce structured conductive material layer 124. Structured conductive material layer 124 can be used to form electrical contacts, such as electrical connections 30, overlying trenches 56, insulating layer 59, and/or top surface 103 of polysilicon structural layer 46 in accordance with the particular design and function of MEMS device 20 (FIG. 1).

Figure 23:
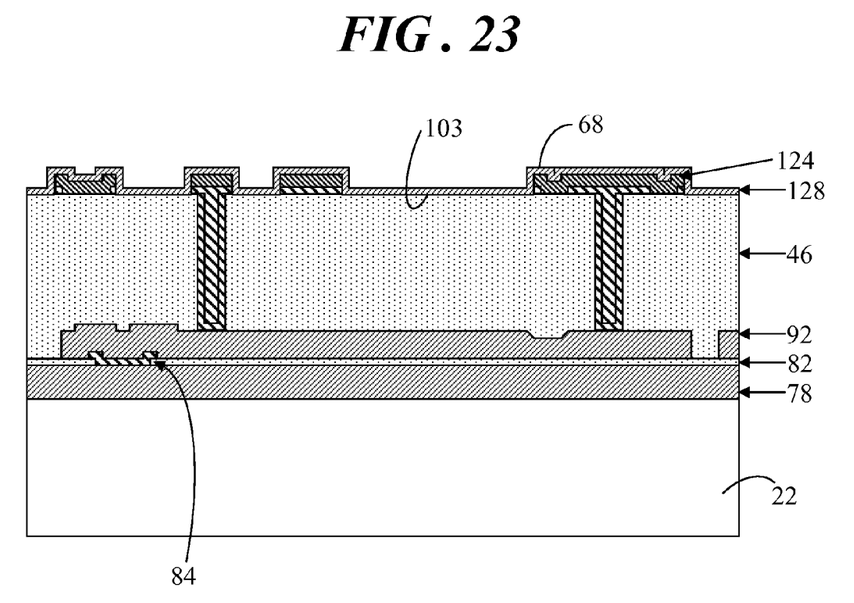
FIG. 23 shows a schematic cross-sectional view illustrating another operation of the fabrication process of FIG. 3.
Figure 24:
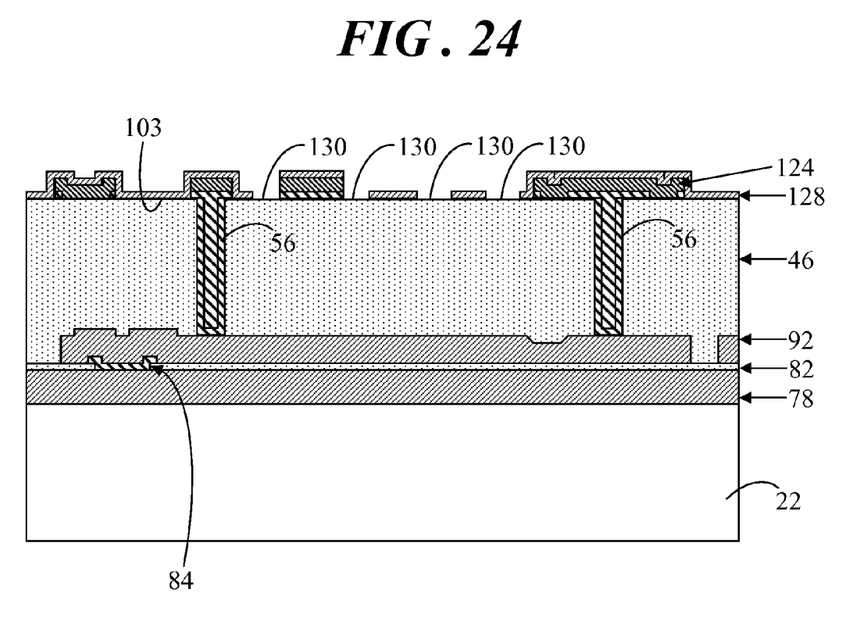
FIG. 24 shows a schematic cross-sectional view illustrating another operation of the fabrication process of FIG. 3.
Figure 25:
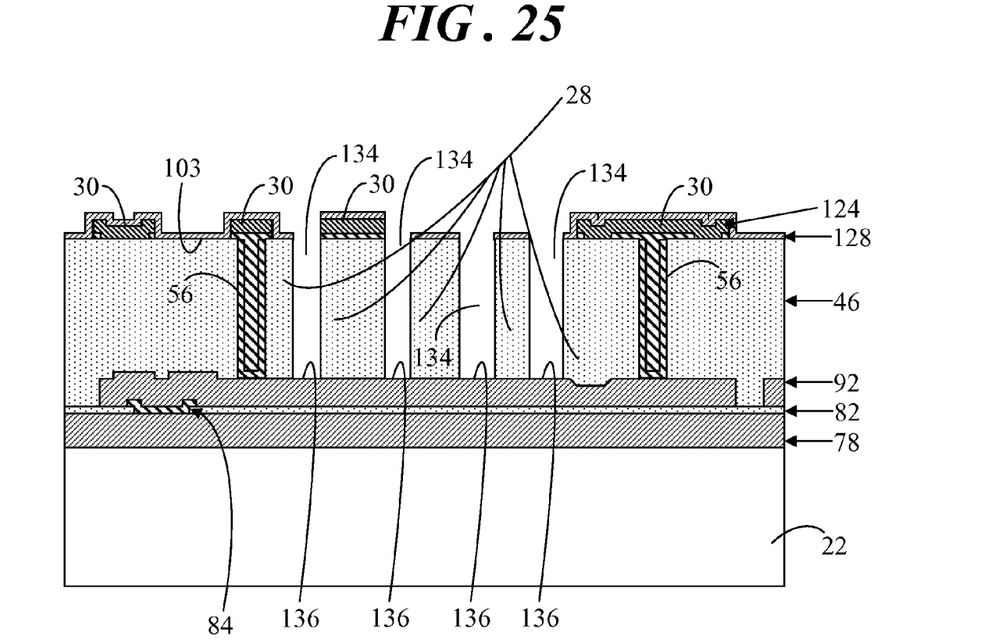
FIG. 25 shows a schematic cross-sectional view illustrating another operation of the fabrication process of FIG. 3.

Referring back to FIG. 3, following task 122, a task 126 is performed. At task 126, proof mass 32 (FIG. 2) and beams 36 (FIG. 2) of microstructures 28 (FIG. 2) are formed in polysilicon structural layer 46. FIGS. 23-25 illustrate the operations occurring at task 126 of fabrication process 60. In FIG. 23, oxide 68 is deposited over top surface 103 of polysilicon structural layer 46 and structured material layer 124 to form an oxide hard mask 128. In an embodiment, oxide hard mask 128 may be formed using a tetraethyl orthosilicate (TEOS) deposition process. Oxide hard mask 128 may have a deposition thickness of approximately six hundred and thirty nanometers.

In FIG. 24, oxide hard mask 128 is patterned using, for example, a photolithographic process, and etched using for example, an oxide RIE process. Etching of oxide hard mask 128 is performed to produce openings 130 in oxide hard mask 128 in accordance with structural pattern for polysilicon structural layer 46 so as to expose polysilicon structural layer 46 at openings 130. In addition, structured conductive material layer 124 may be trim etched. That is, a portion of layer 124 may be trimmed and self-aligned to the structural pattern for polysilicon structural layer 46.

In FIG. 25, passages 134 are formed in polysilicon structural layer 46 through openings 130 (FIG. 24). In an embodiment, passages 134 may be formed by etching through polysilicon structural layer 46 using, for example, polysilicon deep reactive-ion etching (DRIE). The entire thickness of polysilicon structural layer 46 is etched through to expose an underlying portion 136 of sacrificial layer 92 and to form proof mass 32 and beams 36 of microstructures 28 (FIG. 2) in polysilicon structural layer 46 in accordance with the structural pattern.

Figure 26:
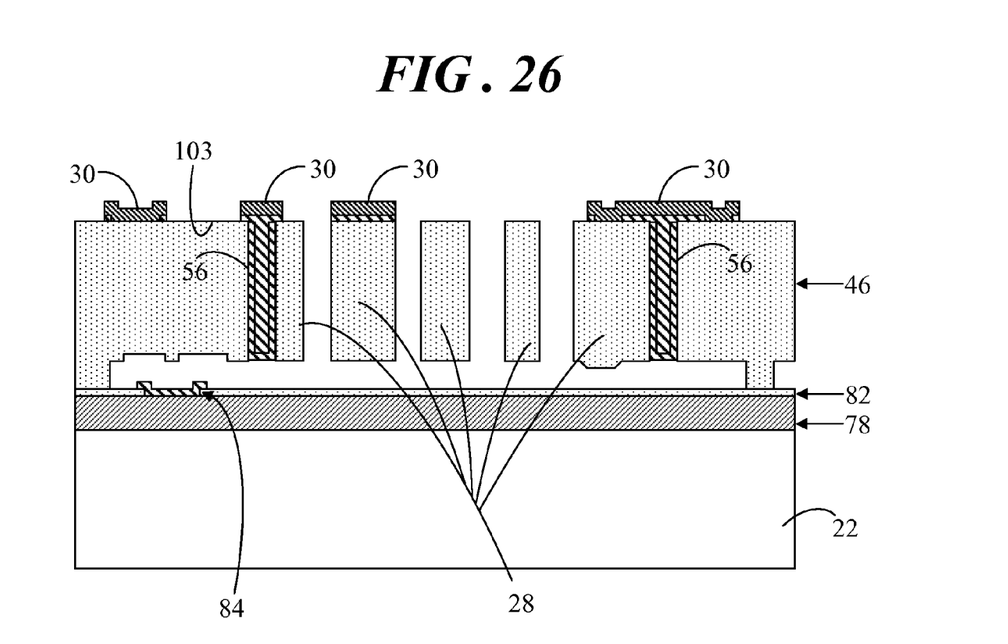
FIG. 26 shows a schematic cross-sectional view illustrating another operation of the fabrication process of FIG. 3.

Referring back to FIG. 3, following task 126, a task 138 is performed. At task 138, microstructures 28 (FIG. 2) are released. FIG. 26 illustrates the operations occurring at task 138 of fabrication process 60. In FIG. 26, etching is performed to remove sacrificial oxide layer 92 and oxide hard mask 128, both of which were illustrated in FIG. 25, but are no longer visible in FIG. 26. In an embodiment, a vapor phase etch (VPE) process may be performed. Vapor phase etching is a dry etched method in which the material to be etched is dissolved at its surface in a chemical reaction with gas molecules. In this example, hydrogen fluoride (HF) gas may be utilized for removing with sacrificial oxide layer 92 and oxide hard mask 128. Following removal of sacrificial oxide layer 92, microstructures 28 are released and are spaced apart from substrate 22. Accordingly, proof mass 32 (FIG. 2) and beams 36 (FIG. 2) of microstructures 28 are now movably suspended, as discussed above in connection with FIG. 2, but are electrically isolated from one another via isolation trenches 56 in accordance with a particular design of MEMS device 20.

Embodiments described herein comprise a microelectromechanical (MEMS) device that includes multiple isolated microstructures and methodology for producing the MEMS device that includes multiple isolated microstructures. The methodology produces a high aspect ratio polysilicon structural layer of multiple microstructures utilizing a surface micromachining process. Isolation trenches are formed in the polysilicon structural layer by selectively etching through the polysilicon structural layer. A dual layer deposition process is performed to deposit a first layer of nitride in the trenches, followed by backfilling the trenches with another layer of nitride. Electrical connections are formed in a top conductive layer. Microstructures are formed in the polysilicon structural layer, and the microstructures are subsequently released through etching of the underlying sacrificial layer. The nitride is preferably silicon-rich nitride for providing electrical and mechanical stress isolation between laterally adjacent microstructures. In addition, the silicon-rich nitride is selected having the desired adhesive properties for bonding with the polysilicon structural layer and with negligible conductivity. Moreover, the methodology may be readily implemented to yield high performance and low cost MEMS device architectures.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A method for producing a micromechanical systems (MEMS) device with isolated microstructures comprising:
   providing a substrate;
   forming a sacrificial layer overlying said substrate;
   forming a polysilicon structural layer overlying said sacrificial layer;
   forming an isolation trench in said polysilicon structural layer by etching said isolation trench through said polysilicon structural layer and depositing an insulating material in said isolation trench to form isolated microstructures in said polysilicon structural layer that are laterally anchored to said isolation trench, said etching said isolation trench exposing an underlying portion of said sacrificial layer, and said depositing said insulating material comprising:
      applying a mask to a top surface of said polysilicon structural layer;
      depositing an insulating film in said isolation trench and overlying said mask, said insulating film lining sidewalls of said polysilicon structural layer and said exposed underlying portion of said sacrificial layer to form a sub-trench;
      depositing a sacrificial material over said insulating film in said isolation trench and on said insulating film overlying said mask, said sacrificial material filling said isolation trench;
      removing said insulating film and said sacrificial material from said top surface using a first etching process;
      removing said sacrificial material from said isolation trench and said mask using a second etching process; and
      depositing said insulating material in said sub-trench to fill said sub-trench following removal of said sacrificial material;
   forming electrical connections over said isolation trench; and
   selectively removing said sacrificial layer such that said isolated microstructures of said MEMS device are spaced apart from said substrate.

2. A method as claimed in claim 1 wherein said insulating material is a nitride.

3. A method as claimed in claim 2 wherein said nitride is a silicon-rich nitride.

4. A method as claimed in claim 3 wherein said silicon-rich nitride exhibits an index of refraction in a range of 2 to 2.5.

5. A method as claimed in claim 1 wherein said first etching process comprises performing reactive ion etching.

6. A method as claimed in claim 1 wherein said second etching process comprises performing buffered oxide etching.

7. A method as claimed in claim 1 wherein:
   said depositing said insulating material in said sub-trench concurrently deposits said insulating material on said top surface of said polysilicon structural layer; and
   said forming said electrical connections comprises:
      selectively removing a portion of said insulating material from said top surface of said polysilicon structural layer to expose interconnect regions of said top surface in accordance with an etching pattern;
      depositing a conductive layer overlying said interconnect regions and a remainder of said insulating material on said top surface; and
      selectively removing said conductive layer to form said electrical connections over said isolation trench.

8. A method as claimed in claim 1 further comprising patterning and etching said polysilicon structural layer to define a beam to be released in response to said removing operation, said beam forming a movably suspended one of said isolated microstructures.

9. A method for producing a micromechanical systems (MEMS) device with isolated microstructures comprising:
   providing a substrate;
   forming a sacrificial layer overlying said substrate;
   forming a polysilicon structural layer overlying said sacrificial layer;
   forming an isolation trench in said polysilicon structural layer by etching said isolation trench through said polysilicon structural layer and depositing an insulating material in said isolation trench to form isolated microstructures in said polysilicon structural layer that are laterally anchored to said isolation trench;
   forming electrical connections over said isolation trench;
   following said forming of said electrical connections, patterning and etching said polysilicon structural layer to define a beam; and
   selectively removing said sacrificial layer such that said isolated microstructures of said MEMS device are spaced apart from said substrate, said beam being released in response to said removing operation, and said beam forming a movably suspended one of said isolated microstructures.

10. A method for producing a micromechanical systems (MEMS) device with isolated microstructures comprising:

providing a substrate;

forming a sacrificial layer overlying said substrate;

forming a polysilicon structural layer overlying said sacrificial layer;

forming an isolation trench in said polysilicon structural layer by etching said isolation trench through said polysilicon structural layer and depositing an insulating material in said isolation trench to form isolated microstructures in said polysilicon structural layer that are laterally anchored to said isolation trench;

forming electrical connections over said isolation trench;

patterning and etching said polysilicon structural layer to define a beam, said patterning and etching exposing said sacrificial layer; and selectively removing said sacrificial layer such that said isolated microstructures of said MEMS device are spaced apart from said substrate, said beam being released in response to said removing operation, and said beam forming a movably suspended one of said isolated microstructures.

* * * * *